United States Patent
Seo et al.

(10) Patent No.: US 8,168,890 B2
(45) Date of Patent: May 1, 2012

(54) PRINTED CIRCUIT BOARD AND COMPONENT PACKAGE HAVING THE SAME

(75) Inventors: Moo-Hong Seo, Daejeon (KR); Jong-Jin Lee, Daejeon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 918 days.

(21) Appl. No.: 12/213,973

(22) Filed: Jun. 26, 2008

(65) Prior Publication Data

US 2009/0178830 A1    Jul. 16, 2009

(30) Foreign Application Priority Data

Jan. 15, 2008  (KR) .................. 10-2008-0004222
Mar. 12, 2008  (KR) .................. 10-2008-0022807

(51) Int. Cl.
*H05K 1/09* (2006.01)
*H05K 1/11* (2006.01)
(52) U.S. Cl. ........................... 174/257; 174/261
(58) Field of Classification Search .............. 174/257; 257/779, 784
See application file for complete search history.

(56) References Cited

U.S. PATENT DOCUMENTS

| | | | | |
|---|---|---|---|---|
| 5,827,604 A | * | 10/1998 | Uno et al. | 428/209 |
| 6,110,608 A | * | 8/2000 | Tanimoto et al. | 257/E23.054 |
| 6,960,396 B2 | * | 11/2005 | Shimokawa et al. | 257/E23.023 |
| 2002/0088845 A1 | * | 7/2002 | Tanaka et al. | 228/254 |
| 2006/0055023 A1 | * | 3/2006 | Ho et al. | 257/692 |
| 2007/0256856 A1 | * | 11/2007 | Ichikawa et al. | 174/257 |

FOREIGN PATENT DOCUMENTS

| | | | |
|---|---|---|---|
| JP | 9-321423 | | 12/1997 |
| JP | 2000036521 A | * | 2/2000 |
| JP | 2002-246510 | | 8/2002 |
| JP | 2002317295 A | * | 10/2002 |
| JP | 2003-7902 | | 1/2003 |
| JP | 2003-282651 | | 10/2003 |

OTHER PUBLICATIONS

Tanaka et al., JP 2002-317295A, Oct. 2002, attached Machine Translation.*
Korean Office Action issued Jun. 26, 2009 in corresponding Korean Patent Application 10-2008-0004222.
Korean Office Action issued on Apr. 22, 2009 in corresponding Korean Patent Application 10-2008-0004222.

* cited by examiner

*Primary Examiner* — Timothy Thompson
*Assistant Examiner* — Roshn Varghese

(57) ABSTRACT

A printed circuit board, a component package that includes the printed circuit board, and a method of manufacturing the component package are disclosed. The printed circuit board, which may include an insulation layer, a pad formed over the insulation layer and wire-bonded to a component, and a tin (Sn) alloy layer formed over the pad, can be manufactured with lower costs and a simpler manufacturing process, where the adhesion provided by the wire-bonding can also be increased.

2 Claims, 10 Drawing Sheets

PRINTED CIRCUIT BOARD AND COMPONENT PACKAGE HAVING THE SAME

CROSS-REFERENCE TO RELATED APPLICATIONS

This application claims the benefit of Korean Patent Applications No. 10-2008-0004222 and No. 10-2008-0022807 filed with the Korean Intellectual Property Office on Jan. 15, 2008, and Mar. 12, 2008, respectively, the disclosure of which are incorporated herein by reference in their entirety.

BACKGROUND

1. Technical Field

The present invention relates to a printed circuit board and a component package having the printed circuit board, as well as a method of manufacturing the component package.

2. Description of the Related Art

In applying a surface treatment over the pads of a printed circuit board, for use in manufacturing a package such as a CSP (chip scale package) and SIP (system-in-package), etc., the conventional method may include forming a nickel (Ni) layer and a gold (Au) layer by electroplating or electroless plating.

That is, a conventional component package 100 may be manufactured by mounting a component 160 on a package substrate, which may consist of pads 120 formed over a surface of an insulation layer 110, a solder resist layer 130 formed over the surface of the insulation layer 110 such that the pads 120 are exposed, and a nickel layer 140 and a gold layer 150 formed over the surface of each pad 120, and then by bonding the component 160 to the pads 120 with a wire 170 by way of the nickel layer 140 and gold layer 150.

Due to the use of the gold layer, however, conventional methods may entail high material costs, and brittle (Ni, Au)Sn$_4$ deposits may occur after soldering, leading to problems of cracking. Also, due to the use of the nickel layer, the adhesion between the component and the pads may be decreased when a wire-bonding procedure is applied.

As such, there is a need for a printed circuit board, a component package, and a method of manufacturing the component package, with which manufacturing costs can be reduced, and with which wire-bonding adhesion between components and pads can be improved.

SUMMARY

An aspect of the invention provides a printed circuit board, which can be manufactured using a simple process and with low costs, and which can improve the adhesion of the wire-bonding. An aspect of the invention also provides a component package that includes the printed circuit board, as well as a method of manufacturing the component package.

Another aspect of the invention provides a printed circuit board that includes an insulation layer, a pad formed over the insulation layer and wire-bonded to a component, and a tin (Sn) alloy layer formed over the pad.

An alloy element of the tin alloy layer may include silver (Ag).

A content of an alloy element of the tin alloy layer can be 1 to 5 weight percent.

A thickness of the tin alloy layer can be 3 to 10 micrometers.

Another aspect of the invention provides a printed circuit board that includes an insulation layer, a pad formed over the insulation layer and wire-bonded to a component, and a tin (Sn) layer formed over the pad.

A thickness of the tin layer can be 3 to 10 micrometers.

Another aspect of the invention provides a component package that includes an insulation layer, a component mounted on the insulation layer, a pad formed over the insulation layer and wire-bonded to the component, and a tin (Sn) alloy layer formed over the pad.

An alloy element of the tin alloy layer may include silver (Ag).

A content of an alloy element of the tin alloy layer can be 1 to 5 weight percent.

A thickness of the tin alloy layer can be 3 to 10 micrometers.

Another aspect of the invention provides a component package that includes an insulation layer, a component mounted on the insulation layer, a pad formed over the insulation layer and wire-bonded to the component, and a tin (Sn) layer formed over the pad.

A thickness of the tin layer can be 3 to 10 micrometers.

Yet another aspect of the invention provides a method of manufacturing a component package that includes providing an insulation layer, on which at least one pad is formed that has a tin layer formed thereon; mounting a component on the insulation layer; and heating the tin layer to a temperature of 50 to 100 degrees Celsius, and wire-bonding the pad with the component.

Providing the insulation layer can include forming the tin layer over the pad by electroplating or electroless plating.

Additional aspects and advantages of the present invention will be set forth in part in the description which follows, and in part will be obvious from the description, or may be learned by practice of the invention.

DETAILED DESCRIPTION

Figure 1:
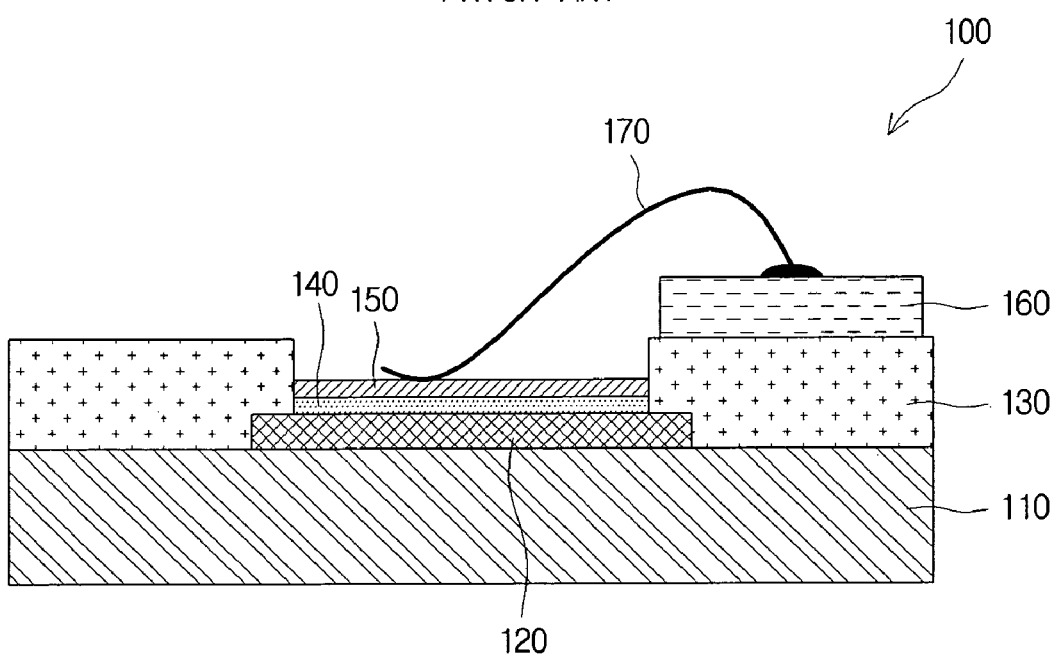
FIG. 1 is a cross sectional view illustrating a component package according to the related art.

The printed circuit board, component package having the printed circuit board, and method of manufacturing the component package according to certain embodiments of the invention will be described below in more detail with reference to the accompanying drawings. Those elements that are the same or are in correspondence are rendered the same reference numeral regardless of the figure number, and redundant explanations are omitted.

In the descriptions provided in this specification, the term "bonding" not only refers to cases where constituents are in direct physical contact with each other, but also encompasses those cases where one or more other parts are placed between the constituents with the constituents touching the respective part or parts.

Figure 2:
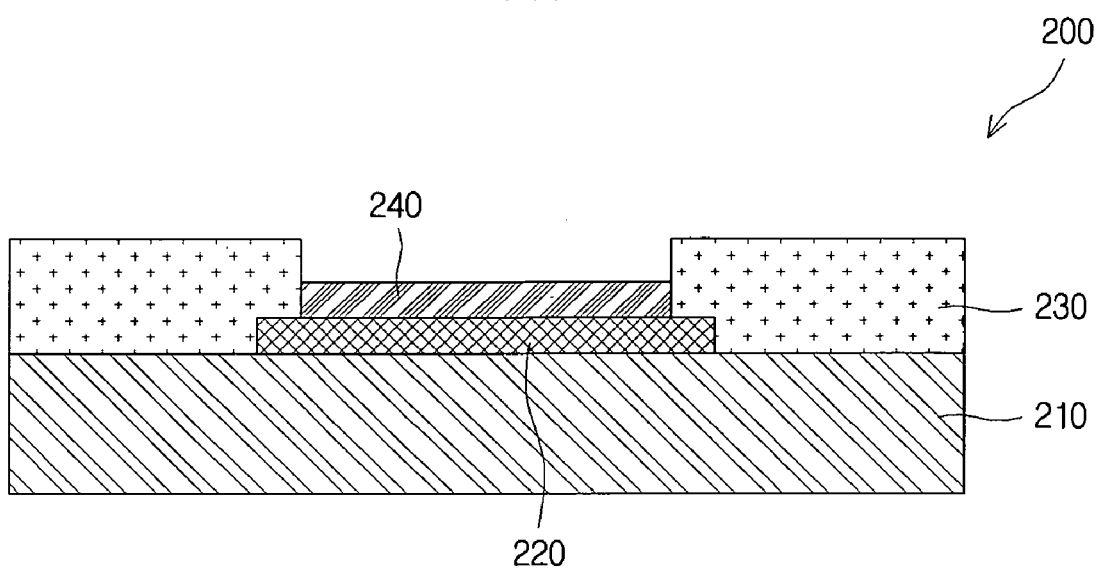
FIG. 2 is a cross sectional view illustrating a printed circuit board according to an embodiment of the invention.

FIG. 2 is a cross sectional view illustrating a printed circuit board according to an embodiment of the invention. In FIG. 2, there are illustrated a printed circuit board 200, an insulation layer 210, a pad 220, a solder resist layer 230, and a supplementary layer 240.

In this embodiment, a printed circuit board 200 is presented, in which a supplementary layer 240, such as a tin layer and a tin alloy layer, etc., can be formed over the surface of the pad 220. In contrast to the conventional method of forming a nickel (Ni) layer and a gold (Au) layer, just one supplementary layer 240 of a tin alloy layer or a tin layer can be formed, so that the manufacturing process may be simplified and manufacturing costs may be reduced. Furthermore, since there is no risk of brittleness caused by reactions in the nickel layer and gold layer, the adhesion between the wire and the pad 220 can be increased when wire-bonding is applied.

A circuit pattern can be formed over a surface of the insulation layer 210, and in cases where a circuit pattern is formed on either side of the insulation layer 210, one or more vias can be formed that penetrate the insulation layer 210 to electrically connect the circuit patterns on both sides. Also on the surface of the insulation layer 210, pads 220 can be formed that may be wire-bonded to a component mounted on the printed circuit board 200 to electrically connect the component. A solder resist layer 230 can be formed over the surface of the insulation layer 210, but with the pads 220 exposed, so that the solder resist layer 230 may protect the circuit pattern.

The circuit pattern and pads 220 can be formed by forming a layer of etching resist over areas of a copper (Cu) layer that will become the circuit pattern and pads 220, for a copper layer formed over the surface of the insulation layer 210, and then removing the portions of the copper layer where the etching resist layer is not formed by etching. The solder resist layer 230 can be formed by coating the surface of the insulation layer 210 with a photosensitive material such that the circuit pattern and pads 220 are covered, and then removing the areas corresponding to the pads 220 by exposure and development according to a photolithography process.

The supplementary layer 240 can be a tin alloy layer or a tin layer. The descriptions below will be provided separately for these two examples, and the example will first be illustrated in which the supplementary layer 240 is a tin alloy layer.

The tin alloy layer can be formed over the surface of the pad 220. Here, the alloy element added to the tin in the tin alloy layer 240 can be silver (Ag), and the content of the alloy element can be 1 to 5 weight percent.

With the tin alloy layer formed over the surface of the pad 220, one end of the wire that electrically connects the component with the pad 220 can be bonded to the tin alloy layer. This can increase the adhesion between the wire and the pad 220, compared to the conventional methods of using a nickel layer and a gold layer, as there may be fewer occurrences of problems caused by brittleness.

Furthermore, with this embodiment, wire boding can be performed using just one tin alloy layer, in contrast to the case of forming a nickel layer and a gold layer, so that the manufacturing process can be simplified and manufacturing costs can be reduced.

The method of forming the tin alloy layer is not limited to a particular technique and can employ such methods as electroplating and electroless plating. As such, the printed circuit board 200 can be implemented with greater flexibility in design.

By adding silver to tin, the hardness of the tin alloy layer can be made greater than the hardness of pure tin and greater, for example, than the hardness of a wire made of gold. As such, the tin alloy layer may not be damaged by the gold wire during wire-bonding, so that the wire-bonding between the pad 220 and the component can be facilitated.

Also, by adding the alloy element of 1 to 5 weight percent to the tin, the hardness of the tin alloy layer can be maintained greater than that of pure tin without significantly increasing material costs and with a low risk of oxidation in the tin alloy layer. At the same time, the hardness of the tin alloy layer can be made greater than that of the gold wire, so that the tin alloy layer may not be damaged by the gold wire during wire-bonding, and the wire-bonding between the pad 220 and the component can be facilitated.

The thickness of the tin alloy layer can be 3 to 10 micrometers. Thus, oxidation of the tin alloy layer can be prevented, and the problem of lowered adhesion during wire-bonding can be prevented that may result when only the areas adjacent to the surface of the tin alloy layer melt and form an interface with the other areas. In this way, the wire-bonding may be further facilitated.

In cases where the tin alloy layer is formed, not on a pad 220 intended for wire-bonding to a component, but over the surface of a solder pad 220 intended for soldering to a mother board, the solder for joining the mother board and the printed circuit board 200 can be made from a metal containing tin, similar to the type of the tin alloy layer, to further increase adhesion between the mother board and the printed circuit board 200.

The results of experiments are provided below on the hardness of the tin alloy layer according to various silver content, thickness, and heating conditions.

Figure 3:
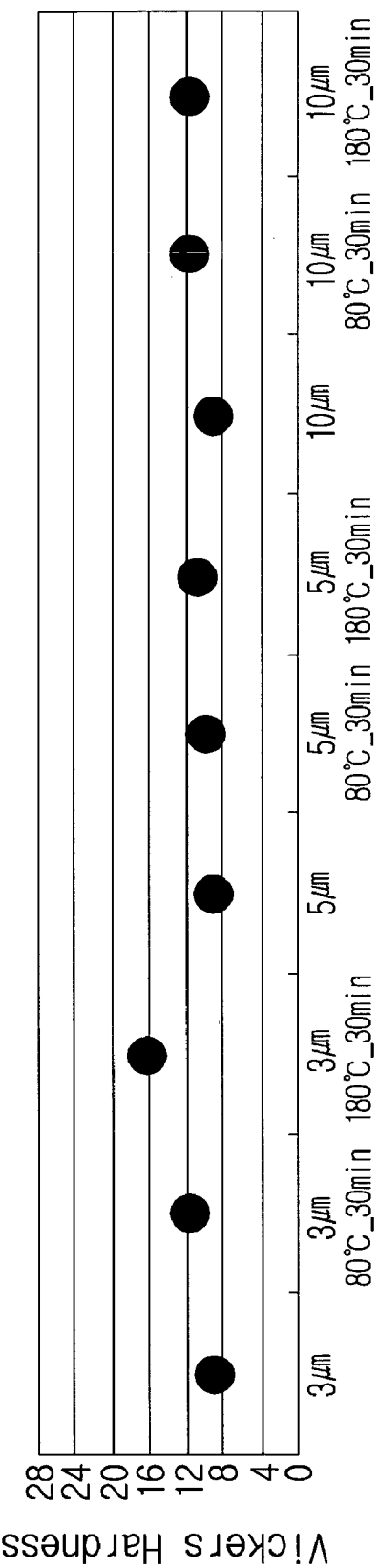
FIG. 3, FIG. 4, and FIG. 5 are graphs representing the hardness of tin alloy layers in a printed circuit board according to an embodiment of the invention for various thicknesses and thermal treatment conditions when the silver content in the tin alloy layer is 1, 2, and 5 weight %, respectively.
Figure 4:
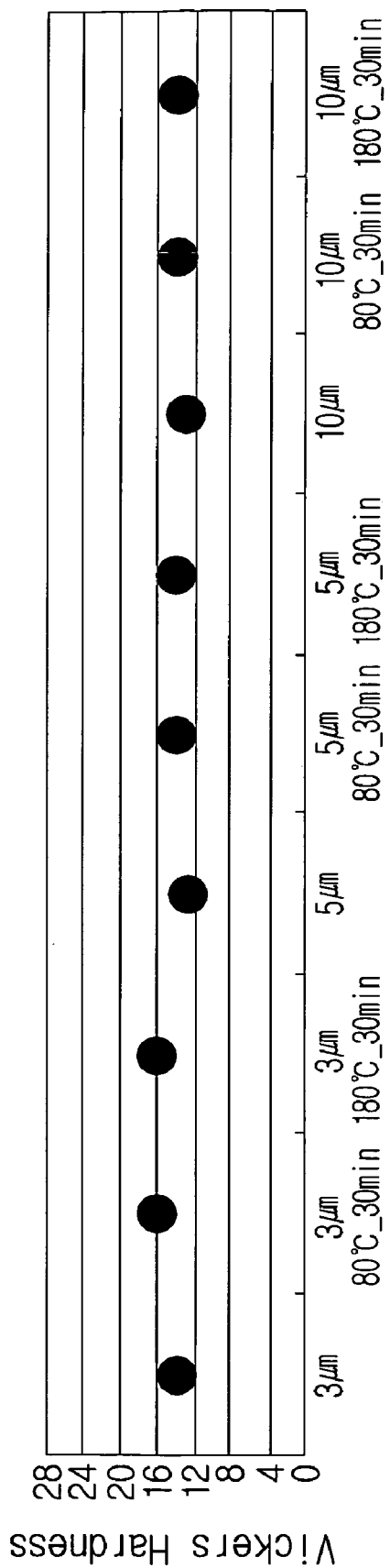
Figure 5:
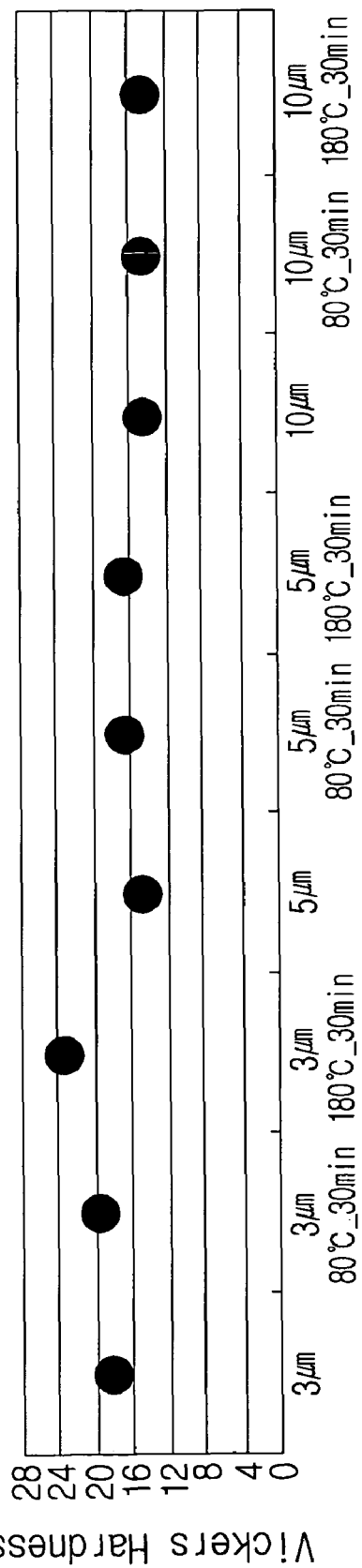

FIGS. 3 to 5 are graphs representing the hardness of tin alloy layers in a printed circuit board according to an embodiment of the invention for various thicknesses and thermal treatment conditions when the silver content in the tin alloy layer is 1, 2, and 5 weight %, respectively.

Also, Table 1 lists the plating conditions used in forming the tin alloy layers over the pad surfaces.

TABLE 1

| Silver Content (weight percentage) | 1 | | | 3 | | | 5 | |
|---|---|---|---|---|---|---|---|---|
| Amount of Plating Liquid (liters) | | | | 4 | | | | |
| Temperature (degrees Celsius) | | | | 25 | | | | |
| Current Density (A/dm2) | | 2 | | | | | 3 | |
| Plating Thickness (micrometers) | 3 | 5 | 10 | | 3 | | 5 | 10 |
| Plating Duration (minutes) | 3.76 | 6.5 | 13 | | 3.76 | | 6.5 | 13 |
| Stirring Rate of Plating Liquid (rpm) | 0 | | | 600 | | | 1600 | |

As shown in Table 1, the hardness of the tin alloy layer plated over a pad 220 was measured for each possible case of the tin alloy layer containing 1, 3, and 5 weight percent of silver, and the plating thickness being 3, 5, and 10 micrometers, with the current density, plating duration, and stirring rate of the plating liquid adjusted accordingly.

The hardness in each case was also measured for various heat-treatment conditions. For example, for the case where the silver content is 1 weight percent and the plating thickness is 3 micrometers, the hardness was measured for each case of no heating, heating for 30 minutes at 80° C., and heating for 30 minutes at 180° C.

Comparing the graphs in FIGS. 3 to 5, for each of the cases where the silver content in the tin alloy layer is 1, 3, and 5 weight percent, it is observed that the tin alloy layer has a Vickers hardness number of about 9 or higher regardless of the thickness of the tin alloy layer. Thus, when wire-bonding is applied, the tin alloy layer may not be damaged by the gold wire, so that the pad 220 and the component may be wire-bonded more effectively. It is also observed that as the silver content is increased from 1 to 5 weight percent, the hardness of the tin alloy layer is also increased.

Also, comparing the hardness of the tin alloy layer according to the thickness of the tin alloy layer in FIGS. 3 to 5, respectively, for each of the cases where the thickness of the tin alloy layer is 3, 5, and 10 micrometers, it is observed that the tin alloy layer has a Vickers hardness number of about 9 or higher regardless of the content of silver in the tin alloy layer. As such, the wire-bonding between the component and the pad 220 can be further facilitated.

As described above, for various heat-treatment conditions, when the thickness of the tin alloy layer is 3 micrometers, an increase in the heating temperature from 80° C. to 180° C. resulted in an increase in hardness regardless of the silver content, due to the effect of the compounds produced when the copper element of the pad 220 reacts with the tin.

Next, the example will be illustrated in which the supplementary layer 240 is a tin layer. The descriptions will be omitted or abridged for features that are substantially the same as or in correspondence with those described for the tin alloy layer, and the following descriptions for the supplementary layer 240 formed as a tin layer will focus more on the differences from the tin alloy layer.

The tin layer can also be formed over the surface of the pad 220, whereby the adhesion between the wire and the pad 220 can be increased, compared to the case of using a nickel layer and a gold layer, while the manufacturing process can be simplified and manufacturing costs can be reduced.

Similar to the tin alloy layer as described above, the method of forming the tin layer is not limited to a particular technique and can include such methods as electroplating and electroless plating, so that the printed circuit board 200 may be implemented with greater flexibility in design.

When mounting and wire-bonding a component onto a printed circuit board 200 according to this embodiment to manufacture a component package, the tin layer can be heated to a temperature of 50 to 100° C., so that unlike the case of heating to 100° C. or higher, the rapid decrease in hardness of the tin layer may be avoided.

When the tin layer is heated to 50 to 100° C., the hardness of the tin layer can be greater, for example, than the hardness of a wire made of gold, so that a component may readily be wire-bonded to the pad 220 using a gold wire without having the wire cause damage to the tin layer.

This will be described later in further detail in the sections describing an embodiment of the invention for a component package.

Similar to the tin alloy layer described above, the thickness of the tin layer can also be 3 to 10 micrometers. Thus, oxidation in the tin layer can be prevented, and the problem of lowered adhesion during wire-bonding can also be prevented that may result when only the areas adjacent to the surface of the tin alloy layer melt and form an interface with the other areas. In this way, the wire-bonding may be further facilitated.

In cases where the tin layer is formed over the surface of a solder pad 220 intended for soldering to a mother board, the adhesion between the mother board and the printed circuit board 200 can be increased in the same manner as that described for the tin alloy layer.

Next, a component package will be described that includes a printed circuit board based on an embodiment of the invention disclosed above.

Figure 6:
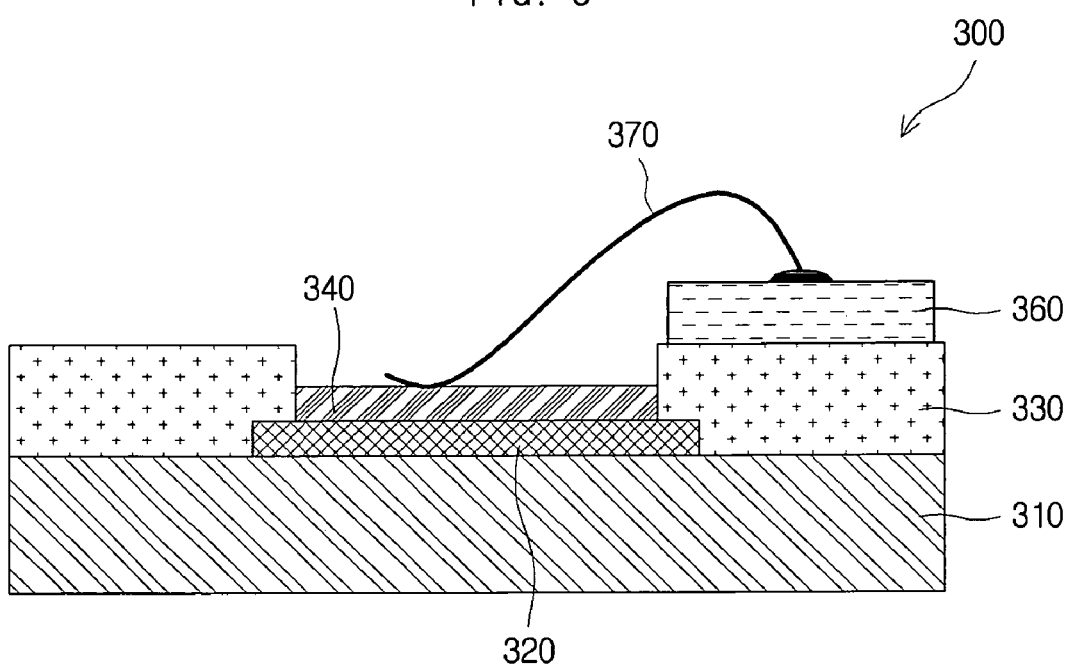
FIG. 6 is a cross sectional view illustrating a component package according to another embodiment of the invention.

FIG. 6 is a cross sectional view illustrating a component package according to another embodiment of the invention. In FIG. 6, there are illustrated a component package 300, an insulation layer 310, a pad 320, a solder resist layer 330, a tin alloy layer 340, a component 360, and a wire 370.

In this embodiment, a component package 300 is presented, in which a supplementary layer 340, such as a tin layer and a tin alloy layer, etc., can be formed over the surface of the pad 320. In contrast to the conventional method of forming a nickel layer and a gold layer, just one supplementary layer 340 of a tin alloy layer or a tin layer can be formed, so that the manufacturing process may be simplified and manufacturing costs may be reduced. Furthermore, since there is no risk of brittleness caused by reactions in the nickel layer and gold layer, the adhesion between the wire 370 and the pad 320 can be increased when wire-bonding is applied.

The insulation layer 310, pad 320, and supplementary layer 340, which can be a tin alloy layer or a tin layer, can be substantially the same as or in correspondence with the respective parts in the printed circuit board of the embodiment described above. As such, the descriptions for these parts will not be repeated, and the following will focus more on the differences from the embodiment described above, namely, the component 360 and the wire 370.

The component 360 can be mounted on the insulation layer 310, i.e. the printed circuit board. By mounting a semiconductor chip, for example, on the printed circuit board, a component package 300, such as a CSP (chip scale package) and SIP (system-in-package), etc., can be implemented.

The component 360 can have electrodes electrically connected by wires 370 to the pads 320 of the printed circuit board. A supplementary layer 340, such as a tin alloy layer and a tin layer, as described above, can be formed over the pads 320, to facilitate the wire-bonding between the electrodes of the component 360 and the pads 320.

The wire 370 can be made from a material such as gold, for example. In cases where the supplementary layer 340 is a tin alloy layer, the addition of the alloy element, such as silver, can increase the hardness to exceed the hardness of the gold wire 370. This can prevent the supplementary layer 340 from being damaged by the wire 370 during wire-bonding, so that the component package 300 may be implemented with higher-quality wire-bonding between the component 360 and the pads 320.

In cases where the supplementary layer 340 is a tin layer, the tin layer can be heated beforehand to a temperature of 50 to 100° C., to prevent the hardness from rapidly decreasing to below the hardness of the wire 370. In this way, the tin layer can be prevented from being damaged by the wire 370, so that the component package 300 may be implemented with higher-quality wire-bonding between the component 360 and the pads 320.

Table 2 represents the results of experiments on the occurrence of successful wire-bonding for various values of electrical power, force, duration of the force, and heating temperature applied to the tin layer. Here, the duration of the force applied for the wire-bonding was kept constant at 15 ms.

TABLE 2

| Power (mW) | Force (gf) | Duration (ms) | Temperature (° C.) | Occurrence of Wire-Bonding |
|---|---|---|---|---|
| 150 | 5 | 15 | 175 | X |
| 200 | 5 | 15 | 175 | X |
| 250 | 5 | 15 | 175 | X |
| 300 | 5 | 15 | 175 | X |
| 150 | 10 | 15 | 175 | X |
| 200 | 10 | 15 | 175 | X |
| 250 | 10 | 15 | 175 | X |
| 300 | 10 | 15 | 175 | X |
| 50 | 5 | 15 | 175 | X |
| 70 | 5 | 15 | 70 | ○ |
| 80 | 5 | 15 | 70 | ○ |
| 90 | 5 | 15 | 70 | ○ |
| 100 | 5 | 15 | 70 | ○ |
| 70 | 10 | 15 | 70 | ○ |
| 80 | 10 | 15 | 70 | ○ |
| 90 | 10 | 15 | 70 | ○ |
| 100 | 10 | 15 | 70 | ○ |
| 60 | 5 | 15 | 70 | ○ |
| 50 | 5 | 15 | 50 | ○ |

As shown in Table 2, if the temperature to which the tin layer was heated was kept at a value between 50 to 100° C., wire-bonding could readily be obtained between the pad 320 and the component 360 regardless of the electrical power or force applied. However, if the temperature to which the tin layer was heated was beyond the range of 50 to 100° C., such as in the samples heated to 175° C., the hardness of the tin layer would be made lower than the hardness of the wire 370, resulting in an unsuccessful wire-bonding.

Next, a method of manufacturing the component package will be described below according to yet another embodiment of the invention.

Figure 7:
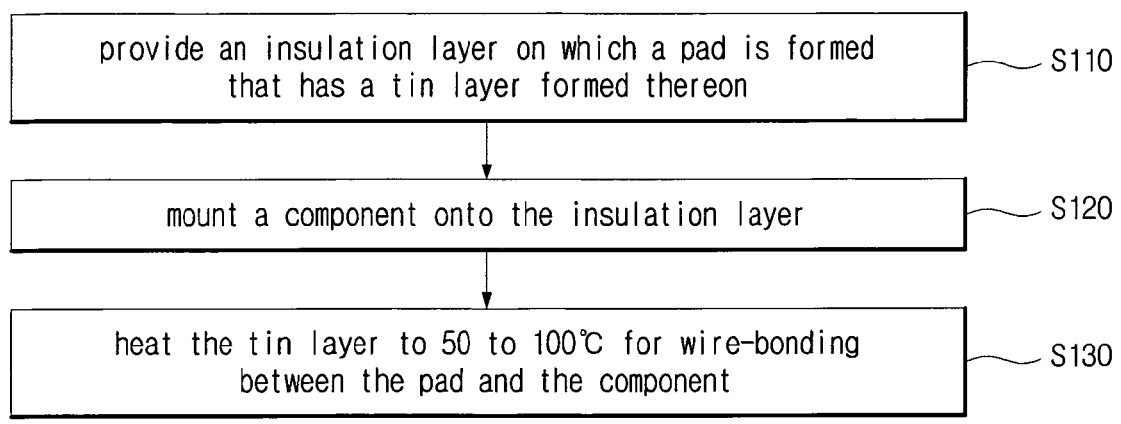
FIG. 7 is a flowchart illustrating a method of manufacturing a component package according to yet another embodiment of the invention.
Figure 8:
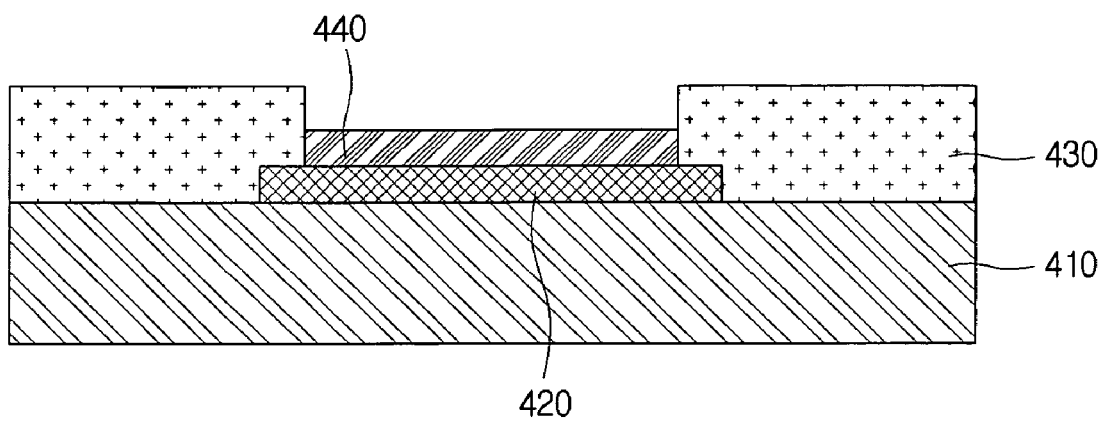
FIG. 8, FIG. 9, and FIG. 10 are cross sectional views each representing a process in a method of manufacturing a component package according to yet another embodiment of the invention.
Figure 9:
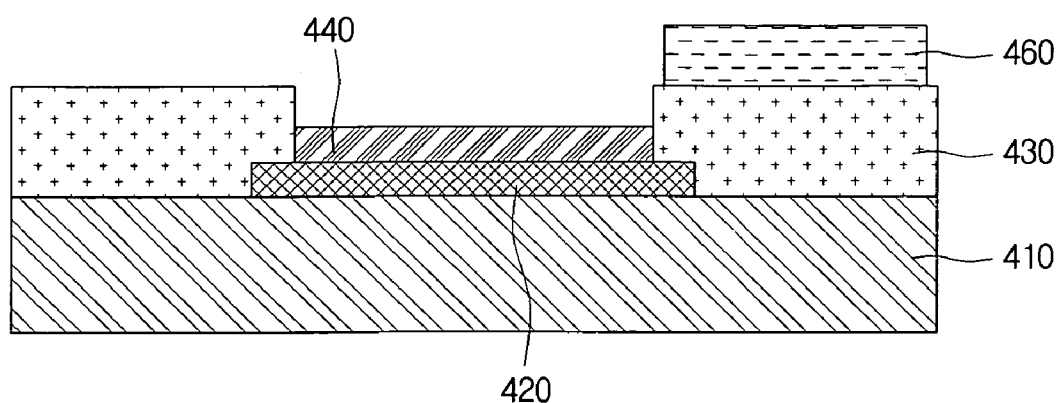
Figure 10:
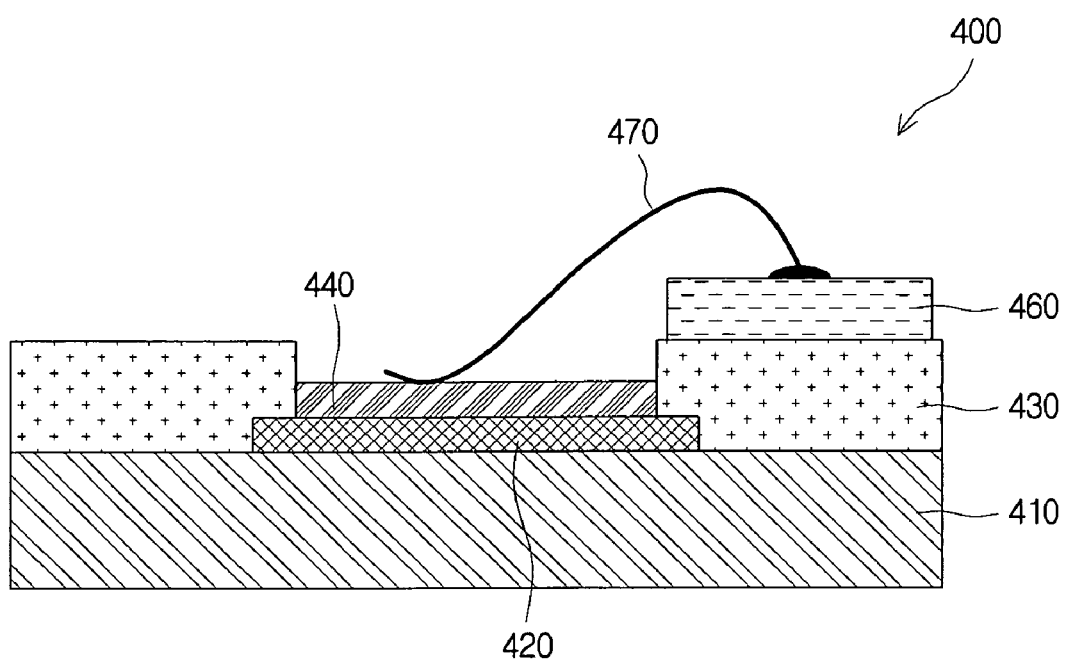

FIG. 7 is a flowchart illustrating a method of manufacturing a component package according to yet another embodiment of the invention, and FIGS. 8 to 10 are cross sectional views each representing a process in a method of manufacturing a component package according to yet another embodiment of the invention.

In FIGS. 8 to 10, there are illustrated a component package 400, an insulation layer 410, a pad 420, a solder resist layer 430, a tin layer 440, a component 460, and a wire 470.

With this embodiment, when wire-bonding the component 460 to the pad 420, on which the tin layer 440 is formed, the tin layer 440 may be heated to a temperature of 50 to 100° C., so that the hardness of the tin layer 440 may be prevented from dropping below the hardness of the wire 470, in contrast to the case of heating to 100° C. or higher. Thus, damage to the tin layer 440 can be avoided, and consequently the method of manufacturing the component package 400 can provide wire-bonding of a higher quality.

First, an insulation layer 410 can be provided, on which pads 420 having tin layers 440 may be formed (S110). A circuit pattern can be formed over a surface of the insulation layer 410, and in cases where a circuit pattern is formed on either side of the insulation layer 410, one or more vias can be formed that penetrate the insulation layer 410 to electrically connect the circuit pattern on either side. Also, the pads 420 can be formed on the surface of the insulation layer 410 that may be wire-bonded to a component 460 mounted on the insulation layer 410 to electrically connect the component 460. A solder resist layer 430 can be formed over the surface of the insulation layer 410, with the pads 420 exposed, so that the solder resist layer 430 may protect the circuit pattern.

The circuit pattern and pads 420 can be formed by forming a layer of etching resist over areas of a copper layer that will become the circuit pattern and pads 420, for a copper layer formed over the surface of the insulation layer 410, and then removing, i.e. by etching, the portions of the copper layer where the etching resist layer is not formed. The solder resist layer 430 can be formed by coating the surface of the insulation layer 410 with a photosensitive material such that the circuit pattern and the pads 420 are covered, and then removing the areas corresponding to the pads 420, i.e. by exposure and development, according to a photolithography process.

The tin layer 440 can be formed over the surface of each of the pads 420. Here, a method of forming the tin layer 440 may include electroplating, for example, to improve adhesion between the pad 420 and tin layer 440 while reducing manufacture costs.

The tin layer 440 can also be formed using electroless plating. As such, a component package 400 can be implemented with improved flexibility in design.

Next, the component 460 can be mounted on the insulation layer 410 (S120). The component 460 can be mounted on the insulation layer 410, i.e. the printed circuit board. By mounting a semiconductor chip, for example, on the printed circuit board, a component package 400, such as a CSP (chip scale package) and SIP (system-in-package), etc., can be implemented.

The component 460 can have electrodes electrically connected by wires 470 to the pads 420 of the printed circuit board, where a tin layer 440 can be formed over each of the pads 420, as described above, to facilitate the wire-bonding between the electrodes of the component 460 and the pads 420.

Next, wire-bonding can be performed between the pads 420 and the component 460 after heating the tin layer 440 to a temperature of 50 to 100° C. (S130). As shown in Table 2 above, if the temperature to which the tin layer is heated to 50 to 100° C., wire-bonding may readily be obtained between the pad 420 and the component 460 independently of the electrical power or force applied. However, if the temperature to which the tin layer is heated is beyond the range of 50 to 100° C., such as a temperature of 175° C., for example, the hardness of the tin layer may be lower than the hardness of the wire 470, so that wire-bonding may not be obtained.

When performing the wire-bonding, the tin layer 440 can be heated beforehand to a temperature of 50 to 100° C., to prevent the hardness from rapidly decreasing to below the hardness of the wire 470. In this way, the tin layer 440 can be prevented from being damaged by the wire 470, so that a component package 400 may be implemented with higher-quality wire-bonding between the component 460 and the pads 420.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention. As such, many embodiments other than those set forth above can be found in the appended claims.

What is claimed is:

1. A printed circuit board comprising: an insulation layer; a pad formed over the insulation layer and wire-bonded to a component; and a tin (Sn) alloy layer formed over the pad, wherein an alloy element of the tin alloy layer is silver (Ag), a content of an alloy element of the tin alloy layer is 1 to 5 weight percent, a thickness of the tin alloy layer is 3 to 10 micrometers, and wherein the tin (Sn) alloy layer has a Vickers hardness number of 9 or higher.

2. A component package comprising: an insulation layer; a component mounted on the insulation layer; a pad formed over the insulation layer and wire-bonded to the component; and a tin (Sn) alloy layer formed over the pad, wherein an alloy element of the tin alloy layer is silver (Ag), a content of an alloy element of the tin alloy layer is 1 to 5 weight percent, a thickness of the tin alloy layer is 3 to 10 micrometers, and wherein the tin (Sn) alloy layer has a Vickers hardness number of 9 or higher.

* * * * *